(12) United States Patent
Watanabe et al.

(10) Patent No.: US 11,024,360 B2
(45) Date of Patent: Jun. 1, 2021

(54) NONVOLATILE SEMICONDUCTOR MEMORY DEVICE

(71) Applicant: KIOXIA CORPORATION, Tokyo (JP)

(72) Inventors: Toshifumi Watanabe, Yokohama Kanagawa (JP); Naofumi Abiko, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/799,402

(22) Filed: Feb. 24, 2020

(65) Prior Publication Data

US 2021/0065770 A1 Mar. 4, 2021

(30) Foreign Application Priority Data

Aug. 28, 2019 (JP) .............................. JP2019-156008

(51) Int. Cl.

| | | |
|---|---|---|
| *G11C 16/04* | (2006.01) | |
| *G11C 16/26* | (2006.01) | |
| *G11C 11/4094* | (2006.01) | |
| *G11C 16/24* | (2006.01) | |
| *G11C 5/14* | (2006.01) | |

(Continued)

(52) U.S. Cl.

CPC ...... *G11C 11/4074* (2013.01); *G11C 11/4076* (2013.01); *G11C 11/4085* (2013.01); *G11C 11/4094* (2013.01); *G11C 11/5628* (2013.01); *G11C 11/5642* (2013.01); *G06F 3/0688* (2013.01); *G06F 11/1072* (2013.01); *G11C 5/147* (2013.01); *G11C 7/12* (2013.01); *G11C 8/08* (2013.01); *G11C 16/0483* (2013.01)

(58) Field of Classification Search

CPC ............ G11C 11/4074; G11C 11/4076; G11C 11/4085; G11C 11/4094; G11C 11/5628; G11C 11/5642

USPC ........................ 365/189.09, 189.011, 189.15

See application file for complete search history.

(56) References Cited

U.S. PATENT DOCUMENTS 8,797,801 B2 * 8/2014 Maejima ................ G11C 16/28
                                                            365/185.18
9,524,787 B2 12/2016 Maejima (Continued)

FOREIGN PATENT DOCUMENTS

JP 6207838 B2 10/2017

OTHER PUBLICATIONS

U.S. Appl. No. 16/552,828, filed Aug. 27, 2019.

*Primary Examiner* — Ly D Pham
(74) *Attorney, Agent, or Firm* — Kim & Stewart LLP

(57) ABSTRACT

A semiconductor memory device includes a memory cell, a word line connected to the memory cell, a source line connected to the memory cell, a bit line connected to the memory cell, and a control circuit configured to perform a read operation on the memory cell. During the read operation, the control circuit applies to the word line a first voltage, a second voltage greater than the first voltage after applying the first voltage, and a third voltage greater than the first voltage and smaller than the second voltage after applying the second voltage, and applies to the source line a fourth voltage according to a timing at which the second voltage is applied to the word line, a fifth voltage smaller than the fourth voltage after applying the fourth voltage, and a sixth voltage greater than the fifth voltage after applying the fifth voltage.

18 Claims, 10 Drawing Sheets

(51) Int. Cl.
*G11C 7/12* (2006.01)
*G11C 7/00* (2006.01)
*G11C 7/06* (2006.01)
*G11C 11/4074* (2006.01)
*G11C 11/4076* (2006.01)
*G11C 11/56* (2006.01)
*G11C 11/408* (2006.01)
G11C 8/08 (2006.01)
G06F 3/06 (2006.01)
G06F 11/10 (2006.01)

(56) References Cited

U.S. PATENT DOCUMENTS

| | | |
|---|---|---|
| 9,570,173 B2 | 2/2017 | Yoshihara et al. |
| 9,589,660 B1 | 3/2017 | Hashimoto et al. |
| 9,672,929 B2 | 6/2017 | Maejima |
| 2017/0062054 A1* | 3/2017 | Maeda ............... G11C 16/0483 |
| 2018/0204625 A1* | 7/2018 | Hioka .................... G11C 16/30 |
| 2019/0287618 A1* | 9/2019 | Kimura ................. G11C 16/16 |
| 2020/0194087 A1* | 6/2020 | Watanabe ........... G11C 11/5642 |
| 2020/0294607 A1* | 9/2020 | Maejima ............ G11C 16/0483 |

* cited by examiner

NONVOLATILE SEMICONDUCTOR MEMORY DEVICE

CROSS-REFERENCE TO RELATED APPLICATION

This application is based upon and claims the benefit of priority from Japanese Patent Application No. 2019-156008, filed Aug. 28, 2019, the entire contents of which are incorporated herein by reference.

FIELD

Embodiments described herein relate generally to a nonvolatile semiconductor memory device.

BACKGROUND

A NAND flash memory is known as a nonvolatile semiconductor memory device.

DETAILED DESCRIPTION

Figure 1:
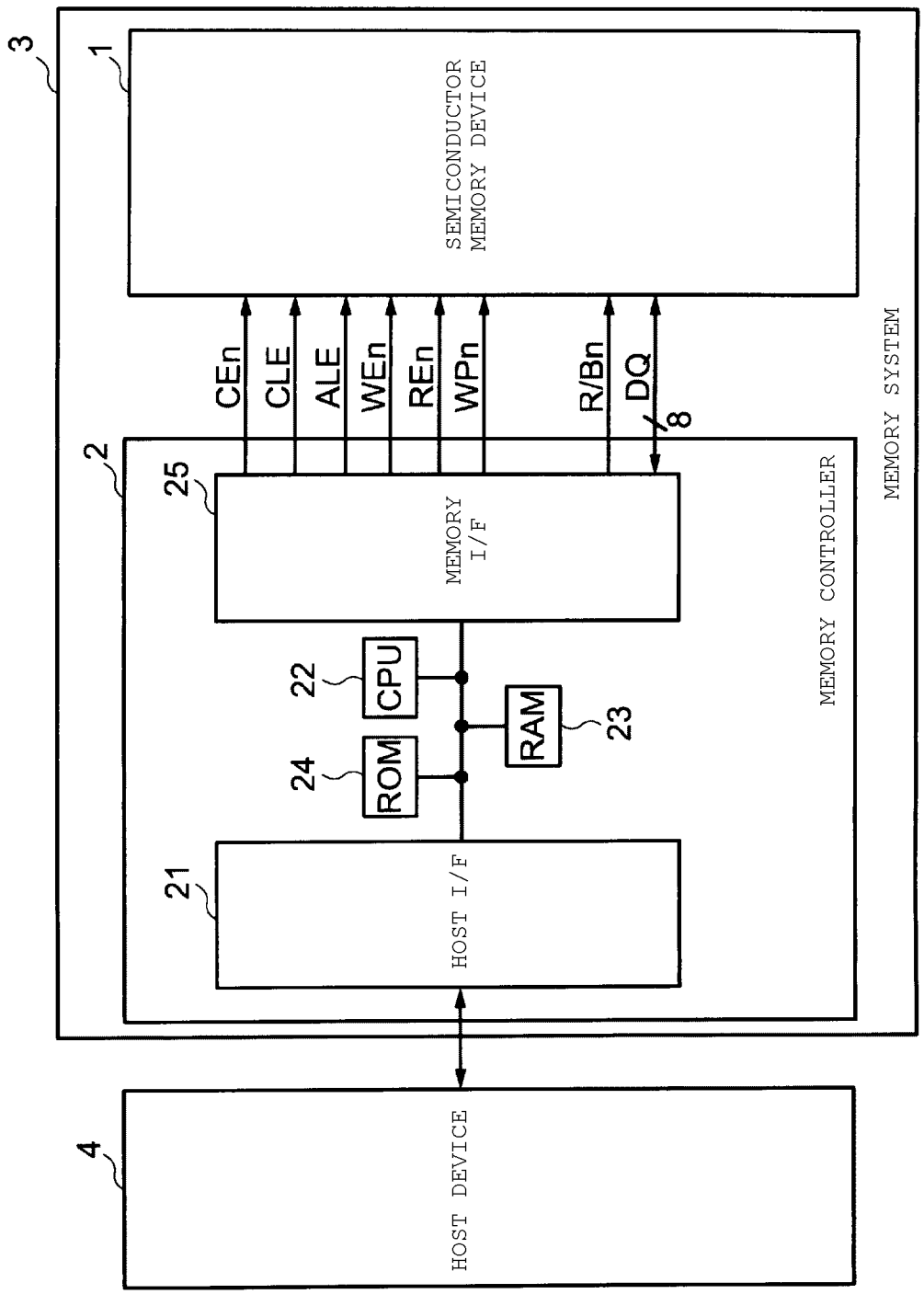
FIG. 1 is a block diagram illustrating an example of a configuration of a memory system including a semiconductor memory device according to a first embodiment.

Embodiments provide a semiconductor memory device capable of high-speed operation.

In general, according to one embodiment, there is provided a semiconductor memory device including a memory cell, a word line connected to the memory cell, a source line connected to the memory cell, a bit line connected to the memory cell, and a control circuit configured to perform a read operation on the memory cell. During the read operation, the control circuit applies to the word line a first voltage, a second voltage greater than the first voltage after applying the first voltage, and a third voltage greater than the first voltage and smaller than the second voltage after applying the second voltage, and applies to the source line a fourth voltage according to a timing at which the second voltage is applied to the word line, a fifth voltage smaller than the fourth voltage after applying the fourth voltage, and a sixth voltage greater than the fifth voltage after applying the fifth voltage.

Hereinafter, embodiments will be described with reference to the accompanying drawings. In the following description, elements having the same function and configuration are denoted by the same reference numerals. When a plurality of elements having the same function and configuration are distinguished, the common reference symbols are distinguished by attaching subscripts. When it is not necessary to distinguish between the plurality of elements having the same function and configuration, only the common reference numerals are attached, and no subscripts are attached.

First Embodiment

A semiconductor memory device 1 according to a first embodiment will be described below.

1. Configuration Example 1-1. Memory System

FIG. 1 is a block diagram illustrating an example of a configuration of a memory system 3 including the semiconductor memory device 1 according to the first embodiment.

As illustrated in FIG. 1, the memory system 3 includes the semiconductor memory device 1 and a memory controller 2, and is connected to a host device 4. The memory system 3 is controlled by the host device 4. The memory system 3 is, for example, a solid state drive (SSD), an SD card, or the like.

For example, the semiconductor memory device 1 is connected to the memory controller 2 and controlled by the memory controller 2. The memory controller 2 receives an instruction from the host device 4 and controls the semiconductor memory device 1 based on the received instruction.

The memory controller 2 includes a host interface unit (host I/F) 21, a central processing unit (CPU) 22, a random access memory (RAM) 23, a read only memory (ROM) 24, and a memory interface unit (memory I/F) 25. The memory controller 2 is configured as, for example, a system on chip (SoC).

The ROM 24 is connected to, for example, the host I/F 21, the CPU 22, the RAM 23, and the memory I/F 25. The ROM 24 stores firmware (program). The RAM 23 is connected to the host I/F 21, the CPU 22, and the memory I/F 25. The RAM 23 may store the firmware and is used as a work area for the CPU 22. The RAM 23 further temporarily stores data and functions as a buffer and a cache. Firmware stored in the ROM 24 and loaded onto the RAM 23 is executed by the CPU 22. With this configuration, the memory controller 2 executes various operations including a read operation, a write operation, and the like, which will be described later, and a part of functions of the host I/F 21 and the memory I/F 25.

The host I/F 21 is connected to the host device 4 via, for example, a bus and manages communication between the memory controller 2 and the host device 4. The memory I/F 25 is connected to the semiconductor memory device 1 via, for example, a memory bus, and manages communication between the memory controller 2 and the semiconductor memory device 1. The memory bus transmits, for example, a chip enable signal CEn, a command latch enable signal CLE, an address latch enable signal ALE, a write enable signal WEn, a read enable signal REn, a write protect signal WPn, a ready/busy signal R/Bn, and a signal DQ from the memory controller 2 to the semiconductor memory device 1. For example, the memory bus transmits the signal DQ from the semiconductor memory device 1 to the memory controller 2.

1-2. Configuration of Semiconductor Memory Device

Figure 2:
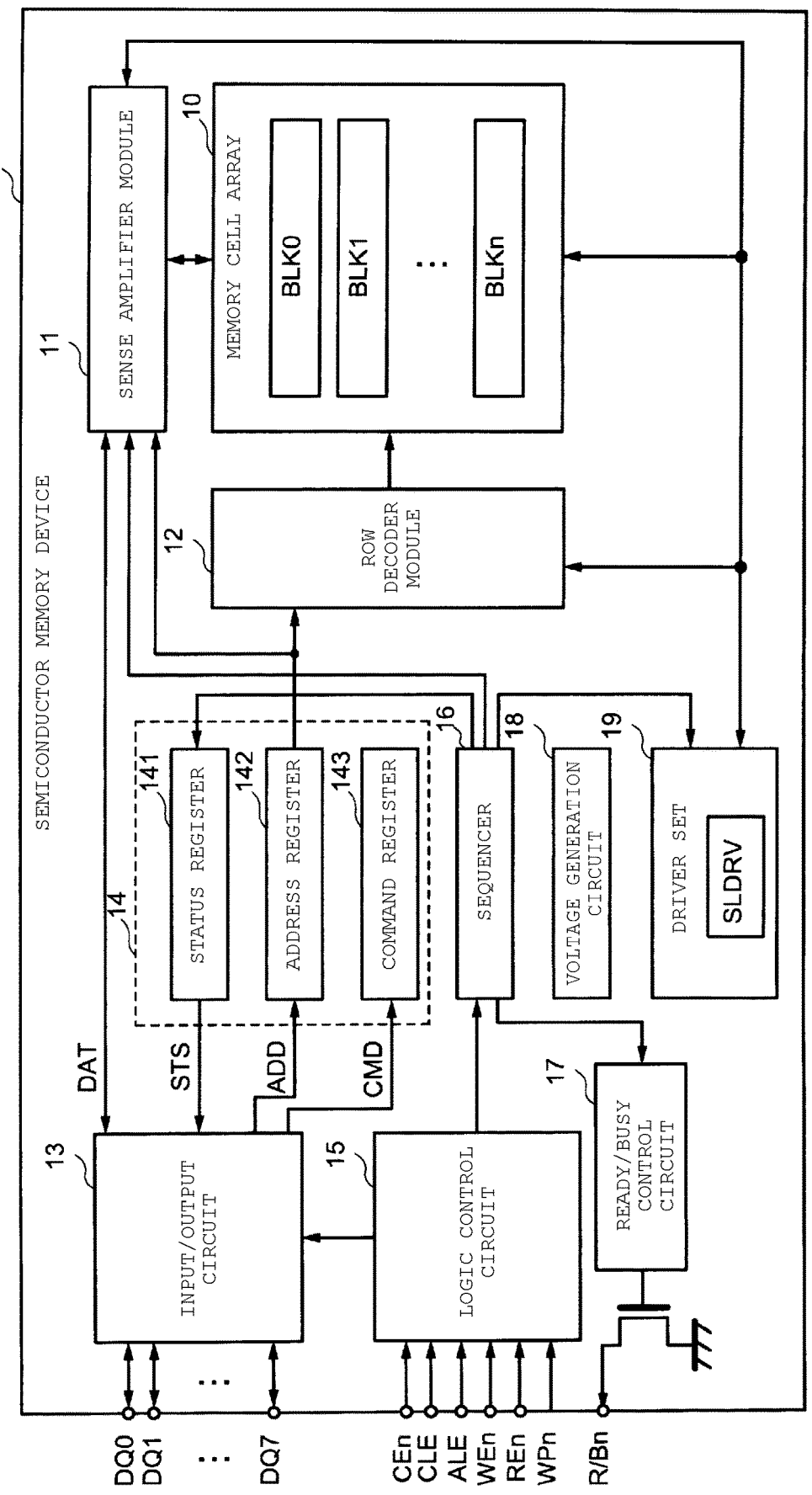
FIG. 2 is a block diagram illustrating an example of a configuration of the semiconductor memory device according to the first embodiment.

FIG. 2 is a block diagram illustrating an example of the configuration of the semiconductor memory device 1 according to the first embodiment. The semiconductor memory device 1 according to the first embodiment is, for example, a NAND flash memory capable of storing data in a nonvolatile manner. Description of a configuration that is the same as or similar to that in FIG. 1 may be omitted.

As illustrated in FIG. 2, the semiconductor memory device 1 includes a memory cell array 10, a sense amplifier module 11, a row decoder module 12, an input/output circuit 13, a register 14, a logic control circuit 15, a sequencer 16, and a ready/busy control circuit 17, a voltage generation circuit 18, and a driver set 19. In the semiconductor memory device 1, various operations such as a write operation for storing write data DAT in the memory cell array 10 and a read operation for reading read data DAT from the memory cell array 10 are executed.

The memory cell array 10 is connected to, for example, the sense amplifier module 11, the row decoder module 12, and the driver set 19. The memory cell array 10 includes blocks BLK0, BLK1, . . . , and BLKn (n is an integer of more than or equal to 1). Block BLK includes a plurality of nonvolatile memory cells associated with bit lines and word lines. The block BLK is, for example, an erase unit of data. In the semiconductor memory device 1, for example, a single-level cell (SLC) method or a multi-level cell (MLC) method may be employed. In the SLC method, data of one bit is stored in each memory cell, and in the MLC method, data of two bits is stored in each memory cell. Data of three bits or more may be stored in each memory cell.

The input/output circuit 13 is connected to the register 14, the logic control circuit 15, and the sense amplifier module 11, for example. The input/output circuit 13 controls input and output of the signal DQ with the memory controller 2. The signal DQ includes a command CMD, data DAT, address information ADD, status information STS, and the like. The command CMD includes, for example, an instruction for executing an instruction from the host device 4. The data DAT includes write data DAT or read data DAT. The address information ADD includes, for example, a column address and a row address. The status information STS includes, for example, information relating to the status of the semiconductor memory device 1 regarding the write operation and the read operation.

More specifically, the input/output circuit 13 includes an input circuit and an output circuit, and the input circuit and the output circuit perform processes described below. The input circuit receives the write data DAT, the address information ADD, and the command CMD from the memory controller 2. The input circuit transfers the received write data DAT to the sense amplifier module 11 and transfers the received address information ADD and command CMD to the register 14. On the other hand, the output circuit receives the status information STS from the register 14 and receives the read data DAT from the sense amplifier module 11. The output circuit transmits the received status information STS and read data DAT to the memory controller 2.

The register 14 includes a status register 141, an address register 142, and a command register 143.

The status register 141 is connected to the input/output circuit 13 and the sequencer 16, for example. The status register 141 stores the status information STS and transfers the status information STS to the input/output circuit 13 based on an instruction from the sequencer 16.

The address register 142 is connected to the sense amplifier module 11, the row decoder module 12, and the input/output circuit 13, for example. The address register 142 stores the address information ADD transferred from the input/output circuit 13. The address register 142 transfers the column address in the address information ADD to the sense amplifier module 11 and transfers the row address in the address information ADD to the row decoder module 12.

The command register 143 is connected to the input/output circuit 13, for example. The command register 143 stores the command CMD transferred from the input/output circuit 13 and transfers the command CMD to the sequencer 16.

The logic control circuit 15 is connected to the sequencer 16, for example. The logic control circuit 15 receives, for example, the chip enable signal CEn, the command latch enable signal CLE, the address latch enable signal ALE, the write enable signal WEn, the read enable signal REn, and the write protect signal WPn, from the memory controller 2. The logic control circuit 15 controls the input/output circuit 13 and the sequencer 16 based on the received signal.

The chip enable signal CEn is a signal used for enabling the semiconductor memory device 1. The command latch enable signal CLE is a signal used to notify the input/output circuit 13 that the signal DQ input to the semiconductor memory device 1 is the command CMD. The address latch enable signal ALE is a signal used to notify the input/output circuit 13 that the signal DQ input to the semiconductor memory device 1 is the address information ADD. Each of the write enable signal WEn and the read enable signal REn is a signal used for instructing the input/output circuit 13 that the signal DQ is an input signal to the semiconductor memory device 1 or an output signal from the semiconductor memory device 1, for example. The write protect signal WPn is a signal used to instruct the semiconductor memory device 1 to prohibit writing of data and erasing of data.

The sequencer 16 is connected to the ready/busy control circuit 17, the sense amplifier module 11, and the driver set 19, for example. The sequencer 16 controls an operation of the entire semiconductor memory device 1 based on the command CMD stored in the command register 143. For example, the sequencer 16 controls the sense amplifier module 11, the row decoder module 12, the voltage generation circuit 18, the driver set 19, and the like, and executes various operations such as a write operation and a read operation.

The ready/busy control circuit 17 generates a ready/busy signal R/Bn according to control by the sequencer 16 and transmits the generated ready/busy signal R/Bn to the memory controller 2. The ready/busy signal R/Bn is a signal used to notify whether the semiconductor memory device 1 is in a ready state in which an instruction from the memory controller 2 can be received or in a busy state in which an instruction cannot be received.

The voltage generation circuit 18 is connected to the driver set 19 or the like, for example. The voltage generation circuit 18 generates a voltage used for a write operation, a read operation, and the like based on control by the sequencer 16 and supplies the generated voltage to the driver set 19.

The driver set 19 includes a driver SLDRV. The driver set 19 is connected to, for example, the memory cell array 10, the sense amplifier module 11, and the row decoder module 12. Based on the voltage supplied from the voltage generation circuit 18, the driver set 19 generates various voltages to be applied to a word line WL and a source line SL described later in various operations such as a read operation and a write operation. The driver set 19 transfers the generated voltage to the sense amplifier module 11 and the row decoder module 12. The driver SLDRV transfers the generated voltage to the source line SL.

The sense amplifier module 11 receives the column address from the address register 142 and decodes the received column address. The sense amplifier module 11 executes a transfer operation of data DAT between the memory controller 2 and the memory cell array 10 based on the decoding result. For example, the sense amplifier module 11 senses data read from the memory cell array 10, generates read data DAT, and outputs the generated read data DAT to the memory controller 2 via the input/output circuit 13. The sense amplifier module 11 also receives write data DAT from the memory controller 2 via the input/output circuit 13 and transfers the received write data DAT to the memory cell array 10.

The row decoder module 12 receives a row address from the address register 142 and decodes the received row address. Based on the decoding result, the row decoder module 12 selects a block BLK to be subjected to execution of various operations such as a read operation and a write operation. The row decoder module 12 can transfer a voltage supplied from the driver set 19 to the selected block BLK.

1-3. Memory Cell Array of NAND Flash Memory

Figure 3:
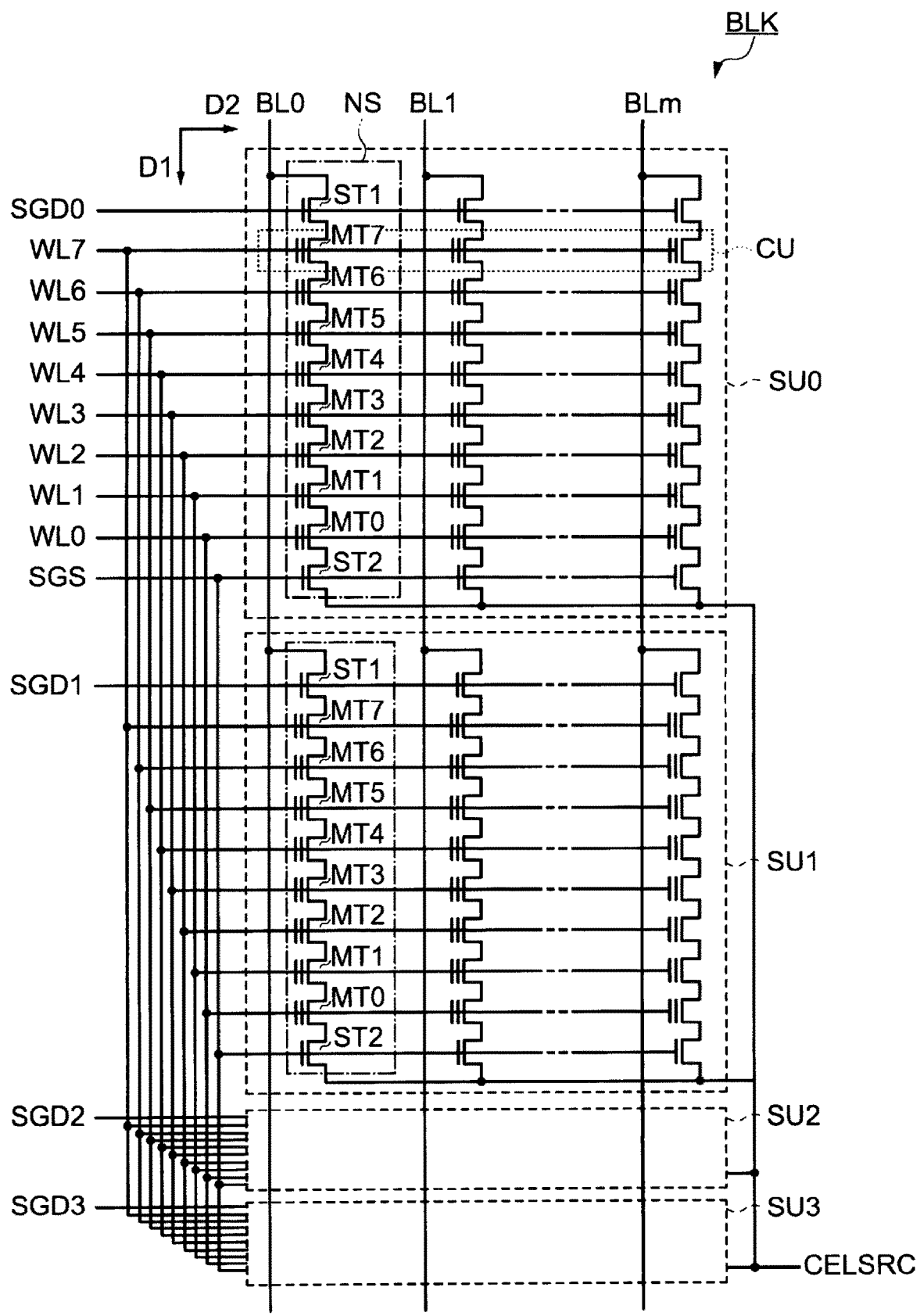
FIG. 3 is a diagram illustrating an example of a circuit configuration of a memory cell array in the semiconductor memory device according to the first embodiment.

FIG. 3 is a diagram illustrating an example of a circuit configuration of one block BLK among a plurality of blocks BLK in the memory cell array 10 as an example of the circuit configuration of the memory cell array 10 illustrated in FIG. 2. For example, each of the plurality of blocks BLK in the memory cell array 10 has a circuit configuration illustrated in FIG. 3. Description of a configuration that is the same as or similar to that in FIG. 1 or 2 may be omitted.

As illustrated in FIG. 3, the block BLK includes, for example, four string units SU0 to SU3. Each string unit SU includes a plurality of NAND strings NS. Each of the plurality of NAND strings NS is associated with a certain bit line BL among bit lines BL0 to BLm (m is an integer of more than or equal to 1), and includes, for example, memory cell transistors MT0 to MT7 and select transistors ST1 and ST2. The memory cell transistor MT includes a control gate and a charge storage layer, and stores data in a nonvolatile manner. Each of the select transistors ST1 and ST2 is used for selecting the NAND string NS including the select transistors ST1 and ST2 in various operations.

In each of the plurality of NAND strings NS, a drain of the select transistor ST1 is connected to the bit line BL associated as described above. The memory cell transistors MT0 to MT7 are connected in series between a source of the select transistor ST1 and a drain of the select transistor ST2. A source of the select transistor ST2 is connected to the source line SL. Although details will be described later, in this specification and the like, an example in which the source line SL is a source line CELSRC is illustrated.

Among the plurality of NAND strings NS in the same block BLK, each of control gates of the memory cell transistors MT0 to MT7 in each NAND string NS is connected in common to corresponding word lines WL among the word lines WL0 to WL7. Each of gates (control gates) of the select transistors ST1 of the plurality of NAND strings NS in each of the string units SU0 to SU3 is connected in common to select gate lines SGD0 to SGD3 corresponding to each string unit SU. Among the plurality of NAND strings NS in the same block BLK, each of gates of the select transistors ST2 in each NAND string NS is connected in common to the select gate line SGS.

Each bit line BL is connected in common to drains of the select transistors ST1 of corresponding NAND strings NS among the plurality of string units SU. The source line SL is shared among the plurality of string units SU.

A set of a plurality of memory cell transistors MT connected to a common word line WL in one string unit SU is referred to as a cell unit CU, for example. For example, when each of the memory cell transistors MT in the cell unit CU stores 1-bit data, data of the cell unit CU is referred to as "1-page data", for example.

The circuit configuration of the memory cell array 10 is not limited to the configuration illustrated in FIG. 3. For example, the number of string units SU in each block BLK may be any number. The number of each memory cell transistors MT and select transistors ST1 and ST2 in each NAND string NS may be any number. The number of word lines WL and select gate lines SGD and SGS varies based on the number of memory cell transistors MT and select transistors ST1 and ST2 in NAND string NS.

1-4. Memory Cell Transistor Threshold Voltage Distribution

Figure 4:
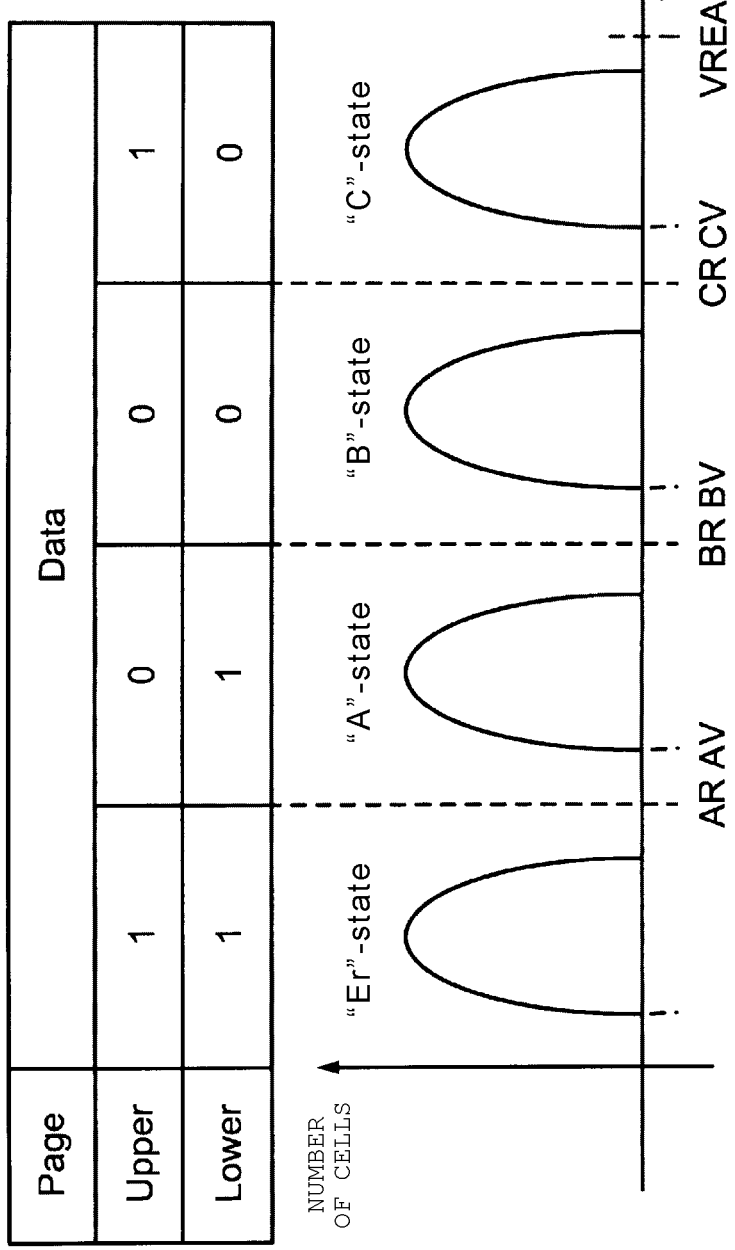
FIG. 4 is a diagram illustrating an example of a threshold voltage distribution of memory cell transistors of the semiconductor memory device according to the first embodiment.

FIG. 4 is a diagram illustrating an example of a threshold voltage distribution, data assignment, read voltage, and verification voltage when the memory cell transistor MT in the memory cell array 10 illustrated in FIG. 1 stores 2-bit data. Description of configurations that are the same as or similar to those in FIGS. 1 to 3 may be omitted.

The memory cell transistor MT stores the 2-bit data based on a voltage difference (hereinafter referred to as a threshold voltage) between the gate and the source that enables the memory cell transistor MT to enter an ON state. In the write operation, the threshold voltage of the memory cell transistor MT is controlled. FIG. 4 illustrates four threshold voltage distributions formed as a result of such control of the threshold voltage. In the threshold voltage distribution illustrated in FIG. 4, the vertical axis corresponds to the number of memory cell transistors MT, and the horizontal axis corresponds to a threshold voltage Vth of the memory cell transistors MT. As an example, the horizontal axis indicates the voltage applied to the gate of the memory cell transistor MT in order to turn the memory cell transistor MT to an ON state when a voltage VSRC is applied to the source of the memory cell transistor MT.

For example, the four threshold voltage distributions are distinguished as the "Er" state, "A" state, "B" state, and "C" state in order from low to high threshold voltage. For example, "11" ("lower bit/upper bit") data is assigned to the "Er" state, "10" data is assigned to the "A" state, "00" data is assigned to the "B" state, "01" data is assigned to the "C" state. The data assigned to the threshold voltage distribution of each state corresponds to the data stored in the memory cell transistor MT whose threshold voltage is within the threshold voltage distribution.

A verification voltage used in each write operation is set between adjacent threshold voltage distributions. Specifically, a verification voltage AV is set corresponding to the "A" state, a verification voltage BV is set corresponding to the "B" state, and a verification voltage CV is set corresponding to the "C" state. The verification voltage is a voltage used in a verification operation for confirming whether or not a target state of the memory cell transistor MT is reached.

More specifically, the verification voltage AV is set between the maximum threshold voltage at the "Er" state and the minimum threshold voltage at the "A" state. When the verification voltage AV is applied to the memory cell transistor MT, the memory cell transistor MT in the threshold voltage distribution whose threshold voltage is "Er" state is turned to an ON state, while the memory cell transistors MT whose threshold voltage falls within the threshold voltage distribution of the "A" state or higher are in the OFF state. With this configuration, for example, as a result of the write operation of "01" data, it is possible to confirm whether or not the threshold voltage of the memory cell transistor MT falls within the threshold voltage distribution of the "A" state.

The other verification voltages EV and CV are set in the same manner as the verification voltage AV. The verification voltage EV is set between the maximum threshold voltage at the "A" state and the minimum threshold voltage at the "B" state, and the verification voltage CV is set between the maximum threshold voltage at the "B" state and the minimum threshold voltage at the "C" state.

A read voltage used in a read operation is set between each adjacent threshold voltage distributions. Specifically, a read voltage AR is set corresponding to the "A" state, a read voltage BR is set corresponding to the "B" state, and a read voltage CR is set corresponding to the "C" state. The read voltage is a voltage used in a read operation for confirming which state the threshold voltage of the memory cell transistor MT falls within.

More specifically, similar to the verification voltage AV, the read voltage AR is set between the maximum threshold voltage at the "Er" state and the minimum threshold voltage at the "A" state. When the read voltage AR is applied to the memory cell transistor MT, the memory cell transistor MT whose threshold voltage falls within the threshold voltage distribution of "Er" state is turned to an ON state, while the memory cell transistors MT whose threshold voltage falls within the threshold voltage distribution of the "A" state or higher are in the OFF state. With this configuration, it is possible to determine whether the threshold voltage of the memory cell transistor MT falls within the threshold voltage distribution of "Er" state or in the threshold voltage distribution of "A" state or higher.

Other read voltages BR and CR are set in the same manner as the read voltage AR. The read voltage BR is set between the maximum threshold voltage at the "A" state and the minimum threshold voltage at the "B" state, and the read voltage CR is set between the maximum threshold voltage at the "B" state and the minimum threshold voltage at the "C" state.

In the first embodiment, for example, the verification voltage AV is set to a voltage higher than the read voltage AR, the verification voltage BV is set to a voltage higher than the read voltage BR, and the verification voltage CV is set to a voltage higher than the read voltage CR. For example, the verification voltage AV is set near the lowest of the threshold voltage distribution of "A" state, the verification voltage BV is set near the lowest of the threshold voltage distribution of "B" state, and the verification voltage CV is set near the lowest of the threshold voltage distribution of "C" state.

A read pass voltage VREAD is set to a voltage higher than the maximum threshold voltage of the threshold voltages of any state. Therefore, the memory cell transistor MT in which the read pass voltage VREAD is applied to the gate thereof is turned to an ON state regardless of stored data.

The configuration relating to the number of bits of data stored in one memory cell transistor MT and assignment of data to the threshold voltage distribution described in the first embodiment is merely an example, and is not limited to this configuration. For example, the configuration relating to the number of bits of data stored in one memory cell transistor MT and assignment of data to the threshold voltage distribution may be a configuration in which data of one bit or three bits or more is stored in one memory cell transistor MT. The configuration of the verification voltage and the read voltage described in the first embodiment is merely an example, and is not limited to this configuration. The configurations of the verification voltage and the read voltage described in the first embodiment may be determined as appropriate without departing from the scope of the disclosure.

Figure 5:
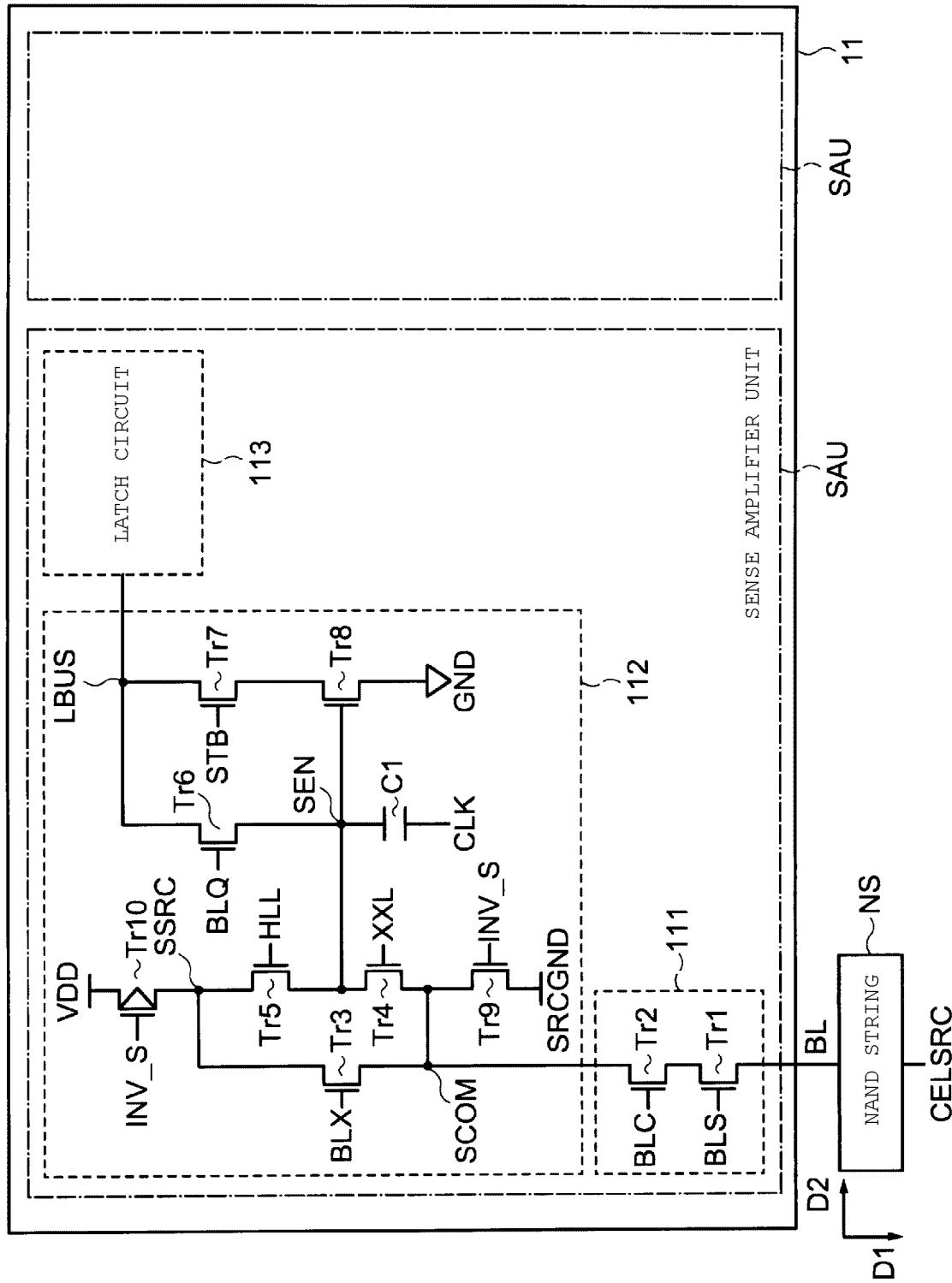
FIG. 5 is a diagram illustrating an example of a part of a circuit configuration of a sense amplifier module in the semiconductor memory device according to the first embodiment.

1-5. Circuit configuration of sense amplifier module FIG. 5 is a diagram illustrating an example of a part of the circuit configuration of the sense amplifier module 11 illustrated in FIG. 2. In the following description, the memory cell transistor MT to be written or read is referred to as a selected memory cell transistor MT. Description of configurations that are the same as or similar to those in FIGS. 1 to 4 may be omitted.

The sense amplifier module 11 includes a sense amplifier unit SAU provided for each bit line, for example. As illustrated in FIG. 5, one sense amplifier unit SAU includes a connection unit 111, a sense unit 112, and a latch circuit 113. When each memory cell transistor MT stores data of two bits or more, two or more latch circuits are provided based on the number of bits of the data.

The connection unit 111 connects the corresponding bit line BL and the sense unit 112. Specifically, the connection unit 111 includes n-channel MOS transistors Tr1 and Tr2. A first terminal of the transistor Tr1 is connected to the corresponding bit line BL, and a second terminal of the transistor Tr1 is connected to a first terminal of the transistor Tr2. A control signal BLS is applied to a gate of the transistor Tr1. A second terminal of the transistor Tr2 is connected to a node SCOM, and the control signal BLC is applied to a gate of the transistor Tr2. The transistor Tr2 makes it possible to clamp the voltage of the corresponding bit line BL according to the control signal BLC.

The sense unit 112 senses data read based on the voltage of the bit line BL. The sense unit 112 includes n-channel MOS transistors Tr3, Tr4, . . . , Tr9, a p-channel MOS transistor Tr10, and a capacitive element Cl.

A first terminal of the transistor Tr3 is connected to the node SCOM, and a second terminal of the transistor Tr3 is connected to a node SSRC. A control signal BLX is applied to a gate of the transistor Tr3. A first terminal of the transistor Tr10 is connected to the node SSRC, and the voltage VDD is applied to a second terminal of the transistor Tr10. A gate of the transistor Tr10 is connected to a node INV_S. A first terminal of the transistor Tr5 is connected to the node SSRC, and a second terminal of the transistor Tr5 is connected to a node SEN. A control signal HLL is applied to a gate of the transistor Tr5. A first electrode of the capacitive element Cl is connected to the node SEN, and a signal CLK is supplied to a second electrode of a capacitive element Cl. A first terminal of the transistor Tr4 is connected to the node SEN and a second terminal of the transistor Tr4 is connected to the node SCOM. A control signal XXL is applied to a gate of the transistor Tr4. A first terminal of a transistor Tr9 is connected to the node SCOM, a second terminal of the transistor Tr9 is connected to a node SRCGND, and a gate of the transistor Tr9 is connected to the node INV_S. A voltage applied to the node SRCGND is, for example, a voltage VSS, which is 0V, for example.

The transistors Tr10 and Tr3 make it possible to precharge the bit line BL. The capacitive element Cl is charged to the precharged voltage of the bit line BL. The transistors Tr10 and Try make it possible to charge the capacitive element Cl. The transistor Tr4 makes it possible to discharge the node SEN during data sensing. The transistor Tr9 makes it possible to fix the bit line BL at a constant voltage.

A first terminal of the transistor Tr6 is connected to the node SEN, and a second terminal of the transistor Tr6 is connected to a node LBUS. A control signal BLQ is applied to a gate of the transistor Tr6. The node LBUS is a signal path that connects the sense unit 112 and the latch circuit 113. A first terminal of the transistor Tr7 is connected to the node LBUS, and a second terminal of the transistor Tr7 is connected to a first terminal of the transistor Tr8. A control signal STB is applied to a gate of the transistor Tr7. A second terminal of the transistor Tr8 is grounded, and a gate of the transistor Tr8 is connected to the node SEN.

The transistor Tr7 makes it possible to determine the sense timing of data and to store the sensed data in the latch circuit 113. The transistor Tr8 makes it possible to sense whether the sensed data is "0" or "1" based on the voltage of the node SEN.

The node INV_S is a node in the latch circuit 113, and may take a logic level corresponding to data stored in the latch circuit 113. For example, when the selected memory cell transistor MT enters an ON state at the time of data reading and the voltage of the node SEN is sufficiently lowered, the node INV_S becomes an H level. On the other hand, when the selected memory cell transistor MT is in the OFF state and the node SEN maintains a constant voltage, the node INV_S is at an L level.

In the configuration of the sense amplifier module 11 of the first embodiment, read data based on the voltage of the node SEN is transferred to the latch circuit 113 by the transistor Tr7 at the timing when the control signal STB is asserted. The control signals STB, BLS, BLC, BLX, HLL, XXL, and BLQ are supplied from the sequencer 16, for example.

The configuration of the sense amplifier module 11 of the first embodiment is an example, and is not limited to this configuration. The configuration of the sense amplifier module 11 of the first embodiment may be determined as appropriate without departing from the scope of the disclosure. For example, various configurations may be employed based on the configuration of the memory system 3, the host device 4, and the like.

1-6. Circuit Configuration of Driver SLDRV

Figure 6:
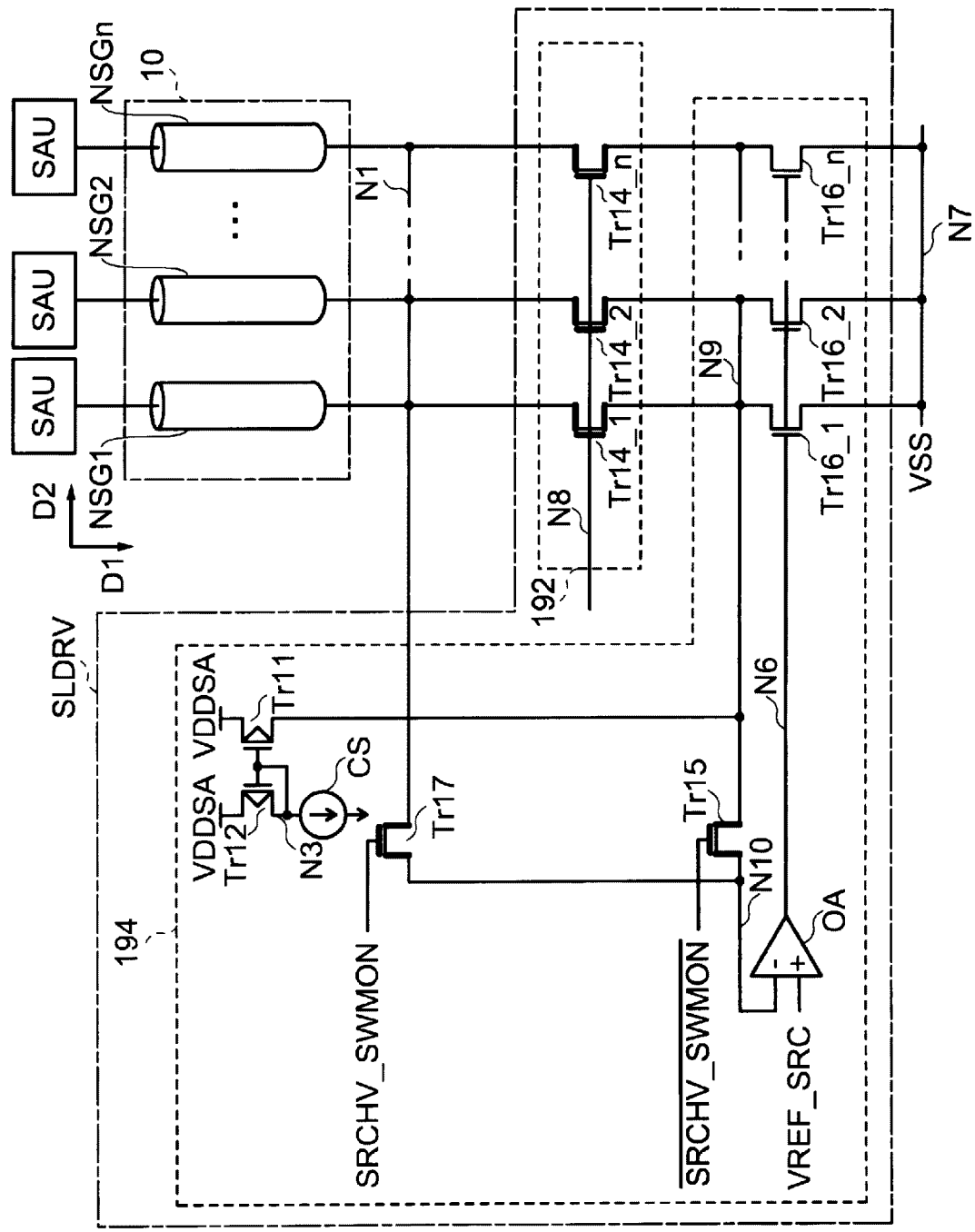
FIG. 6 is a diagram illustrating an example of a circuit configuration of a certain driver in the semiconductor memory device according to the first embodiment.

FIG. 6 is a diagram illustrating an example of a circuit configuration of the driver SLDRV. Description of configurations that are the same as or similar to those in FIGS. 1 to 5 may be omitted.

In FIG. 6, NAND string groups NSG1, NSG2, . . . , and NSGn including one or more NAND strings NS in the memory cell array 10 are illustrated, in addition to the circuit configuration of the driver SLDRV.

The NAND string groups NSG1, NSG2, . . . , and NSGn are commonly connected to a node N1. The node N1 corresponds to the source line SL. The source line SL is the source line CELSRC. Here, k is any integer from 1 to n.

The driver SLDRV includes a discharge unit 192 and a reference voltage setting unit 194. In the following, the configuration of the driver SLDRV is not limited to the configuration illustrated in FIG. 6. In the configuration illustrated in FIG. 6, the classification of the discharge unit 192 and the reference voltage setting unit 194 is merely for convenience. For example, the configuration of the driver SLDRV may be a configuration in which predetermined circuit of each of the discharge unit 192 and the reference voltage setting unit 194 is separately present in a separate device.

The discharge unit 192 includes high breakdown voltage n-channel MOS transistors Tr14_1, Tr14_2, . . . , and Tr14_n.

A first terminal of a transistor Tr14_k is connected to the node N1, and a second terminal of the transistor Tr14_k is connected to a node N9. A gate of the transistor Tr14_k is connected to a node N8. Here, k is any integer from 1 to n. The same control signal is applied to gates of the transistors Tr14_1, Tr14_2, . . . , and Tr14_n by the sequencer 16, for example.

The reference voltage setting unit 194 includes p-channel MOS transistors Tr11 and Tr12, a current source CS, an operational amplifier OA, high breakdown voltage n-channel MOS transistors Tr15 and Tr17, and n-channel MOS transistors Tr16_1, Tr16_2, . . . , and Tr16_n.

A voltage VDDSA is applied to a first terminal of the transistor Tr11, a second terminal of the transistor Tr11 is connected to the node N9, and a gate of the transistor Tr11 is connected to a node N3. The voltage VDDSA is applied to a first terminal of the transistor Tr12, and a second terminal and gate of the transistor Tr12 are connected to a node N3. An input terminal of the current source CS is connected to the node N3, and an output terminal of the current source CS is grounded.

A first terminal of the transistor Tr15 is connected to the node N9, and a second terminal of the transistor Tr15 is connected to a node N10. An inverted signal of a control signal SRCHV_SWMON is applied to a gate of the transistor Tr15. The control signal SRCHV_SWMON is supplied by the sequencer 16, for example. An inverting input terminal of the operational amplifier OA is connected to the node N10, and a voltage VREF_SRC is applied to a non-inverting input terminal of the operational amplifier OA. An output terminal of the operational amplifier OA is connected to a node N6. A first terminal of each of transistors Tr16_1, Tr16_2, . . . , and Tr16_n is connected to the node N9, and a second terminal of each of the transistors Tr16_1, Tr16_2, . . . , and Tr16_n is connected to a node N7. The voltage VSS is applied to the node N7. A gate of each of the transistors Tr16_1, Tr16_2, . . . , and Tr16_n is connected to the node N6. A first terminal of a transistor Tr17 is connected to the node N1, and a second terminal of the transistor Tr17 is connected to the node N10. The control signal SRCHV_SWMON is applied to a gate of the transistor Tr17.

Although details will be described later, the voltage of the node N1 is set to a voltage corresponding to the voltage VREF_SRC by the configuration of the driver SLDRV illustrated in the first embodiment. That is, the voltage of the source line CELSRC may be controlled to a voltage corresponding to the voltage VREF_SRC from a near-end side to a far-end side. In this specification and the like, a direction parallel to a direction extending from the bit line BL to the source line CELSRC of the NAND string NS is set as a first direction D1, and a direction crossing the first direction D1 and parallel to a direction in which the word line WL extends (the direction directed from the bit line BL1 to the bit line BLn) is set as a second direction D2. In the word line WL and the source line CELSRC, the bit line BL1 side is indicated as a near-end (Near) with respect to the second direction D2, and the bit line BLn side is indicated as a far-end (Far) with respect to the second direction D2. In addition, the bit line BL1 is indicated as being on the near-end side and the bit line BLn is indicated as being on the far-end side.

2. Example of Operation 2-1. Overview of Write Operation and Read Operation

The semiconductor memory device 1 according to the first embodiment repeatedly executes a software program loop in the write operation. The software program loop includes a program operation and a verify operation. The program operation is an operation of increasing the threshold voltage of the selected memory cell transistor MT by injecting electrons into the charge storage layer in the selected memory cell transistor MT. Alternatively, the program operation is an operation of maintaining the threshold voltage of the selected memory cell transistor MT by inhibiting injection of electrons into the charge storage layer. The verify operation is an operation of confirming whether or not the threshold voltage of the selected memory cell transistor MT has reached a target state by an operation of performing reading using the verification voltage, following the program operation. After that, the selected memory cell transistor MT whose threshold voltage has reached the target state is inhibited from writing.

In the semiconductor memory device 1 according to the first embodiment, the threshold voltage of the selected memory cell transistor MT is increased to the target state by repeatedly executing the software program loop including the program operation and the verify operation described above.

The electrons stored in the charge storage layer may be stored in an unstable state. For that reason, the electrons stored in the charge storage layer of the memory cell transistor MT from the time when the program operation described above is completed may escape from the charge storage layer with the lapse of time. When the electrons escape from the charge storage layer, the threshold voltage of the memory cell transistor MT is lowered. For that reason, in the read operation executed after the completion of the write operation, the read operation is performed using a read voltage lower than the verification voltage in order to cope with such a decrease in the threshold voltage of the memory cell transistor that may occur with the lapse of time.

A read operation may include a verify operation. An example of the operation described below is an example in which the read operation of the semiconductor memory device 1 includes the verify operation.

2-2. Examples of Various Voltages Used in Read Operation

Figure 7:
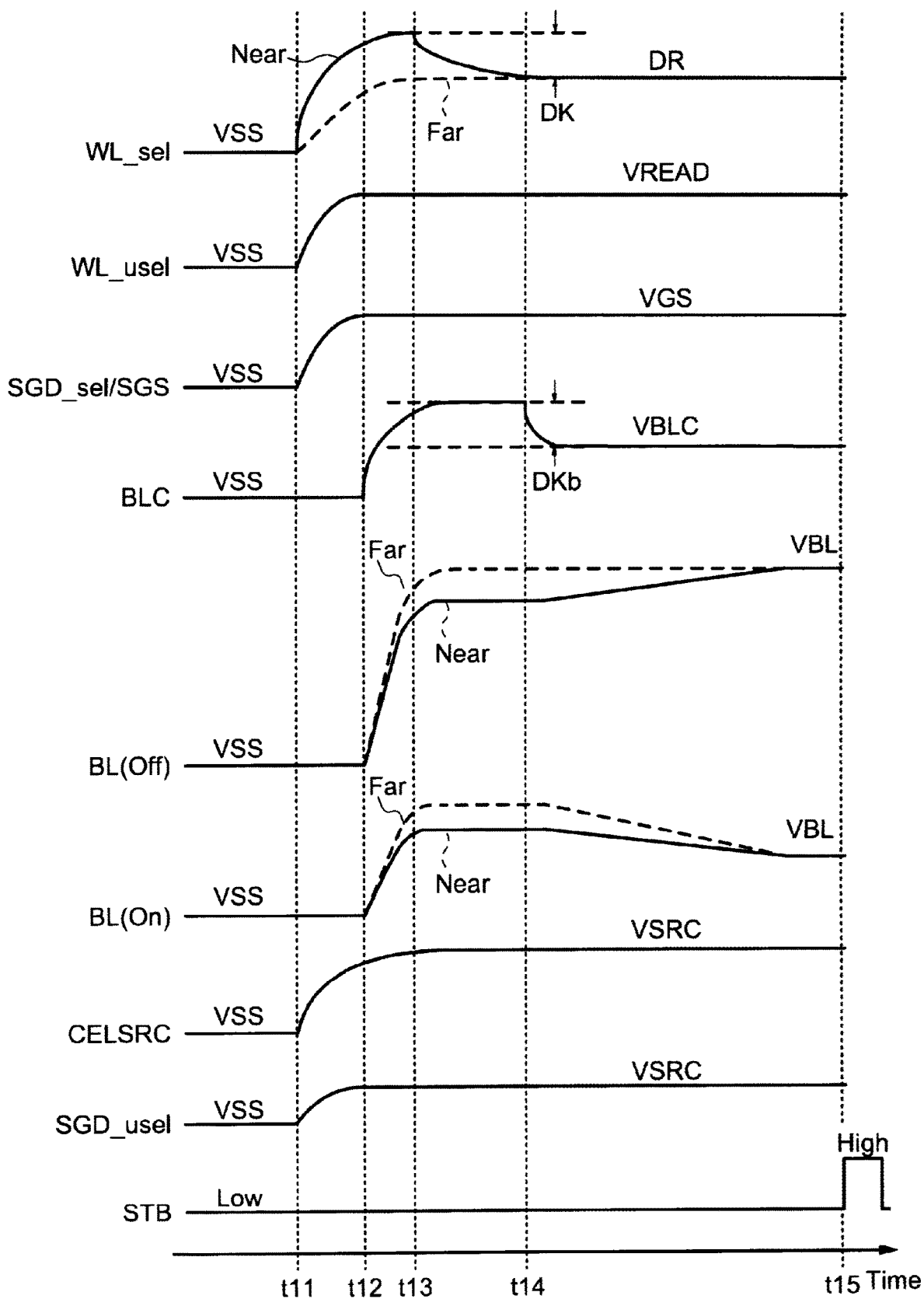
FIG. 7 is a timing chart illustrating an example of changes in voltages applied to various circuit components used in a read operation according to a comparative example.

FIG. 7 is a timing chart illustrating an example of changes in voltages applied to various circuit components used in the read operation in the semiconductor memory device according to a comparative example. The semiconductor memory device according to the comparative example does not have a configuration in which the voltage of the source line CELSRC may be controlled from the near-end side to the far-end side, like the driver SLDRV illustrated in FIG. 6.

Figure 8:
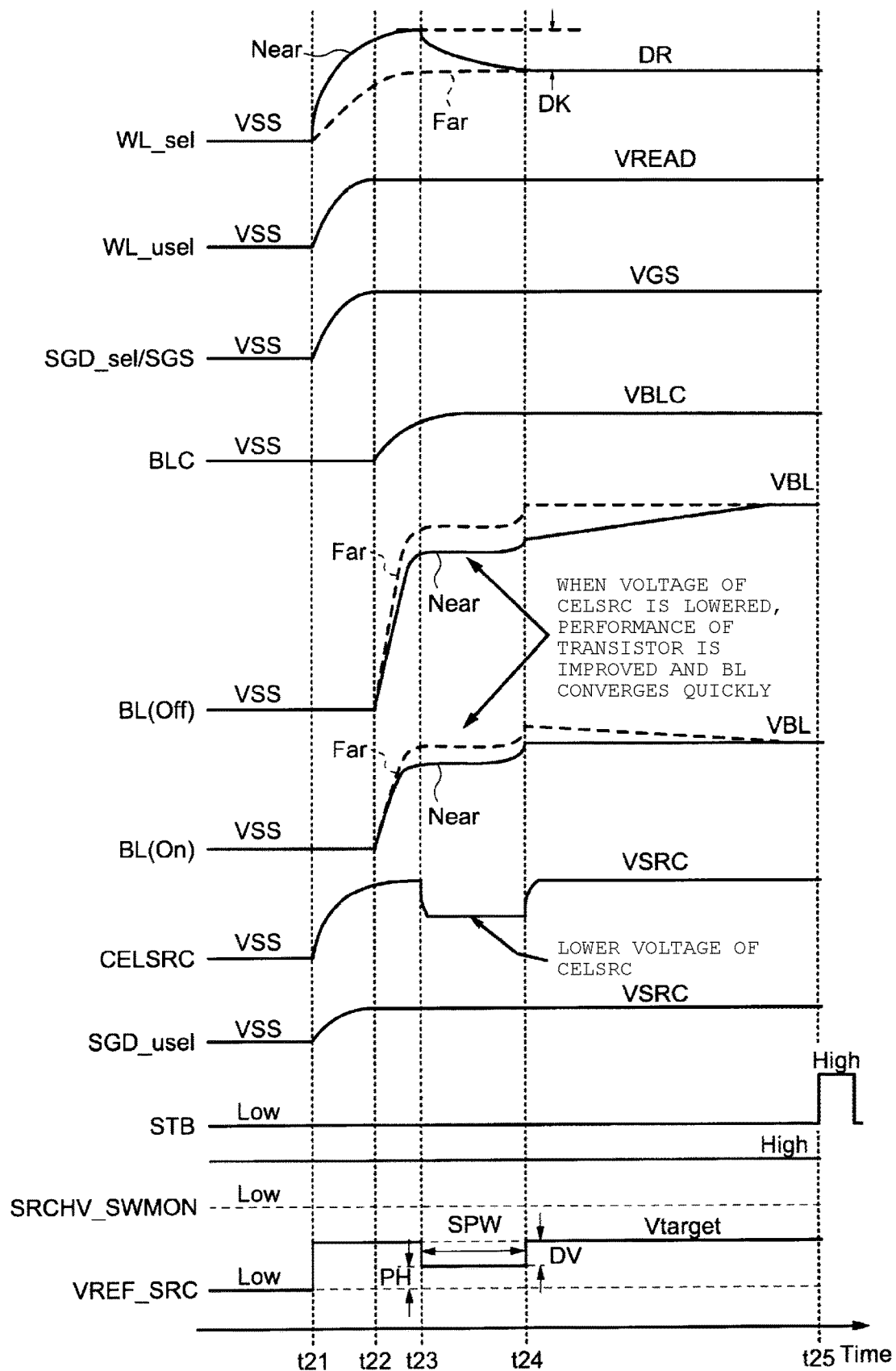
FIG. 8 is a timing chart illustrating an example of changes in voltages applied to various circuit components used in a read operation according to the first embodiment.

FIG. 8 is a timing chart illustrating an example of changes in voltages applied to various circuit components used in the read operation in the semiconductor memory device 1 according to the first embodiment.

The timing charts illustrated in FIGS. 7 and 8 are only schematic timing charts for illustrating voltages applied to various circuit components, and do not necessarily accurately illustrate, for example, changes in the voltage of the bit line BL and the like when the bit line BL is discharged. In the FIGS. 7 and 8, an example of a case where a read operation using a predetermined read voltage DR is executed in the read operation is illustrated. In the read operation, for example, a read operation using the read voltage AR, a read operation using the read voltage BR, and a read operation using the read voltage CR may be performed in succession, and a process similar to that described below may be applied to the read operation using the verification voltage. Description of configurations that are the same as or similar to those in FIGS. 1 to 6 may be omitted.

In the following description, a word line connected to the selected memory cell transistor MT is referred to as a selected word line WL_sel, and a word line not connected to the selected memory cell transistor MT is referred to as a non-selected word line WL_usel. Among the select gate lines SGD, the select gate line SGD of the selected string unit SU is referred to as a selected select gate line SGDsel, and the select gate line of a non-selected string unit SU is referred to as a non-selected select gate line SGD_usel.

As described above, application of voltages to the word lines WL_sel and WL_usel and the select gate lines SGD_sel, SGD_usel, and SGS is executed by control of the voltage generation circuit 18, the driver set 19, and the row decoder module 12, by the sequencer 16. Application of a voltage to the source line CELSRC is executed by control of the voltage generation circuit 18 and the driver SLDRV in the driver set 19, by the sequencer 16. Application of a voltage to the bit line BL is executed by control of the voltage generation circuit 18, the driver set 19, and the sense amplifier module 11, by the sequencer 16. Furthermore, the control signals BLC and STB are supplied by the sequencer 16.

In the comparative example illustrated in FIG. 7, at the start of the read operation, the voltages applied to the word lines WL_sel and WL_usel, the select gate lines SGD_sel, SGD_usel, and SGS, the bit line BL, and the source line CELSRC each are the voltage VSS. The voltage of the control signal BLC is the voltage VSS, and the voltage of the control signal STB is at a low level.

Here, when the voltage is applied to the word line WL, for example, due to RC delay, a time until a voltage of a portion of the word line WL that is physically close to a position where the voltage is applied is stabilized may be relatively short and the time until a voltage of a portion of the word line WL that is physically far from the position where the voltage is applied is stabilized may be relatively long. In the following, as an example, description will be made on an assumption that the portion of the word line WL that takes a relatively short time until the voltage is stabilized is on the near-end side of the word line WL, and description will be made on an assumption that the portion of the word line WL that takes a relatively long time until the voltage is stabilized is on the far-end side of the word line WL.

As illustrated in FIG. 7, in the read operation, a kick operation is executed on the selected word line WL_sel. The kick operation refers to an operation in which a voltage higher than a certain target voltage is applied for a certain time before the target voltage is applied, for example, when the target voltage is applied to a target wiring and a voltage of the wiring is increased. By executing the kick operation on the selected word line WL_sel, the time until the voltage at the far-end side of the selected word line WL_sel is stabilized by the target voltage is shortened. Here, in the following, for example, a voltage higher than the target voltage is referred to as a kick voltage, and a difference in magnitude between the kick voltage and the target voltage is referred to as a kick amount.

First, a read operation using the predetermined read voltage DR is executed. At time t11, a voltage obtained by adding a kick amount DK to a predetermined read voltage DR, which is a target voltage, is applied to the selected word line WL_sel, and the voltage VREAD is applied to the word line WL_usel. Thereafter, at time t13, the predetermined read voltage DR is applied to the selected word line WL_sel. As such, the kick operation is performed on the selected word line WL_sel. As a result of the kick operation, the voltage (the voltage indicated by the solid line with the symbol of "Near") of the portion on the near-end side of the selected word line WL_sel may be higher than the voltage stabilized by the read voltage DR.

At time t11, for example, a voltage VSRC which is the target voltage is applied to the source line CELSRC, a voltage VGS is applied to the select gate lines SGD_sel and SGS, and the voltage VSRC is applied to the select gate line SGD_usel.

Subsequently, for example, at time t12, charging of the bit line BL is started. During the charging, at time t12, a voltage of the control signal BLC is set to a voltage obtained by adding a kick amount DKb to a voltage VBLC which is the target voltage. As a result, the voltage VBL which is the target voltage is applied to the bit line BL. Thereafter, at time t14, the voltage of the control signal BLC is set to the voltage VBLC. Similar to the selected word line WL_sel, a voltage obtained by adding the kick amount DKb to the voltage VBLC may be applied to the control signal BLC at time t11, and the voltage VBLC may be applied to the control signal BLC at time t13.

In this way, a kick operation is also executed on the control signal BLC according to the kick operation on the selected word line WL_sel.

Time t13 corresponds to, for example, the time when the voltage (indicated by the symbol "Far") of the portion on the far-end side of the selected word line WL_sel is stabilized. That is, time t13 may be set as a time at which the voltage at the portion of far-end side of the selected word line WL_sel reaches a voltage stabilized by a predetermined read voltage DR that is a target voltage or a time before and after that, based on the time required for the voltage at the portion of far-end side of the selected word line WL_sel to rise due to the voltage obtained by adding the kick amount DK to the predetermined read voltage DR.

After the respective voltages of the word lines WL_sel and WL_usel, the select gate lines SGD_sel, SGD_usel, and SGS, the bit line BL, and the source line SL are stabilized by the voltages applied in this way, at time t15, the control signal STB changes from a low level to a high level and is asserted. With this configuration, read data based on a predetermined read voltage DR is transferred to the latch circuit in the sense amplifier module 11.

As described above, the kick operation executed on the control signal BLC corresponds to the kick operation executed on the selected word line WL_sel. In the example of related art illustrated in FIG. 7, the time for discharging or charging the bit line BL is delayed by the kick operation of the word line WL_sel. In order to speed up the time for discharging or charging the bit line BL, the kick operation is executed on the control signal BLC. However, when the kick operation is executed on the control signal BLC, the voltage difference between the gate of the transistor Tr2 and the first terminal of the transistor Tr2 increases. As a result, the bit line BL connected to the connection unit 111 including the transistor Tr2 is overcharged and takes time to be discharged to the target voltage, and thus the time (for example, the time from time t13 to time t15) until the read operation increases.

On the other hand, as illustrated in FIG. 8, in the semiconductor memory device 1 according to the first embodiment, the voltage VBLC which is the target voltage is applied to the control signal BLC, and a voltage lower than the voltage applied first is applied to the source line CELSRC. By doing so, the voltage difference between the gate of the memory cell transistor MT and the terminal connected to the select transistor TS2 of the memory cell transistor MT can be increased. As a result, in the semiconductor memory device 1 according to the first embodiment, overcharging of the bit line BL is reduced, and the time until the bit line BL is discharged to the target voltage can be shortened. In the semiconductor memory device 1 according to the first embodiment, it is possible to shorten the time until the bit line BL is discharged to the target voltage, and accordingly, the read operation can be speeded up.

Hereinafter, the read operation of the semiconductor memory device 1 according to the first embodiment will be described in detail with reference to FIG. 8. FIG. 8 differs from FIG. 7 in temporal changes in voltages applied to the control signal BLC, the bit line BL, and the source line CELSRC. FIG. 8 differs from FIG. 7 in that a voltage VREF_SRC and a control signal SRCHV_SWMON are added. In the description of the read operation of the semiconductor memory device 1 according to the first embodiment with reference to FIG. 8, the description similar to that in FIG. 7 is omitted. In the description of the read operation of the semiconductor memory device 1 according to the first embodiment with reference to FIG. 8, an example is given in which the inverted signal of the control signal SRCHV_SWMON is at a low level and the control signal SRCHV_SWMON is at a high level. In FIG. 8, the description of the inverted signal of the control signal SRCHV_SWMON is omitted.

From time t21 to time t23, for example, the voltage VREF_SRC changes from the low level to a target voltage Vtarget. Ideally, when the voltage VREF_SRC changes from the low level to the voltage VSRC, the voltage of the source line CELSRC changes from the voltage VSS to the voltage VSRC, and the target voltage Vtarget is the voltage VSRC, and the low level is the voltage VSS. Actually, the target voltage Vtarget is adjusted so that the voltage of the source line CELSRC becomes the voltage VSRC, and the low level is adjusted so that the voltage of the source line CELSRC becomes the voltage VSS, by resistance, capacitance, and the like caused by transistors, wirings, and the like.

At time t22, charging of the bit line BL is started. In the charging, at time t22, the voltage of the control signal BLC is set to the voltage VBLC which is the target voltage.

Subsequently, at time t23, the voltage VREF_SRC changes to a voltage (voltage Vtarget−voltage DV) that is lower than the voltage Vtarget by the voltage DV. As a result of the voltage VREF_SRC changing to a voltage (voltage Vtarget −voltage DV) that is lower than the voltage Vtarget by the voltage DV, a voltage (voltage VSRC−voltage Vcelsrc) lower than the voltage VSRC by the voltage Vcelsrc is applied to the source line CELSRC by the discharge unit 192 and the reference voltage setting unit 194 illustrated in FIG. 6. Here, ideally, the voltage DV is the voltage Vcelsrc, but, actually, similarly to the target voltage Vtarget and the voltage VSRC, and the low level and the voltage VSS, the voltage DV is adjusted so that the voltage of the source line CELSRC becomes the voltage Vcelsrc by resistance, capacitance, and the like caused by transistors, wirings, and the like.

As a voltage (VSRC-Vcelsrc) lower than the voltage VSRC by the voltage Vcelsrc is applied to the source line CELSRC, the voltage difference between the gate of the memory cell transistor MT and the terminal connected to the select transistor TS2 of the memory cell transistor MT increases, and thus the bit line BL can be charged quickly. As a result, the voltage applied to the bit line BL converges to a constant value faster than in the example of related art.

At time t24, the voltage VREF_SRC changes from a voltage (voltage Vtarget–voltage DV) lower than the voltage Vtarget by the voltage DV to the voltage Vtarget. As a result, the voltage VSRC is applied to source line CELSRC by the discharge unit 192 and the reference voltage setting unit 194 illustrated in FIG. 6. Here, for example, a time width during which the voltage VREF_SRC changes is referred to as a transition time SPW, and a change in the voltage VREF_SRC (voltage difference between the target voltage Vtarget and the voltage DV) is referred to as a voltage difference PH. For example, a time period during which a voltage lower than the voltage VSRC which is the target voltage is applied to the source line CELSRC is referred to as a source line voltage drop width CPW.

From time t24 to time t25, the voltage VBLC which is the target voltage is applied to the control signal BLC, and the voltage VSRC is applied to the source line CELSRC. As a result, the voltage VBL which is the target voltage is applied to the bit line BL.

After the voltages of the word lines WL_sel and WL_usel, the select gate lines SGD_sel, SGD_usel, and SGS, the bit line BL, and the source line CELSRC each are stabilized by the voltage applied in this way, the control signal STB changes from the low level to the high level and is asserted at time t25. With this configuration, read data based on a predetermined read voltage DR is transferred to the latch circuit in the sense amplifier module 11.

2-3. Modification Example of Read Operation

Figure 9A:
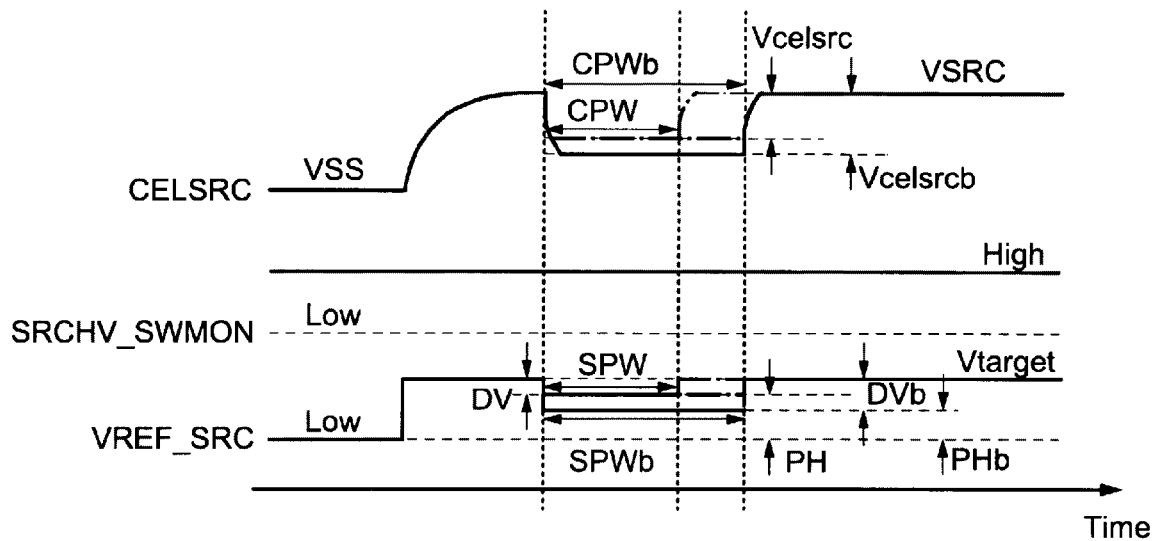
FIGS. 9A and 9B are timing charts illustrating a modification example of the read operation according to the first embodiment.
Figure 9B:
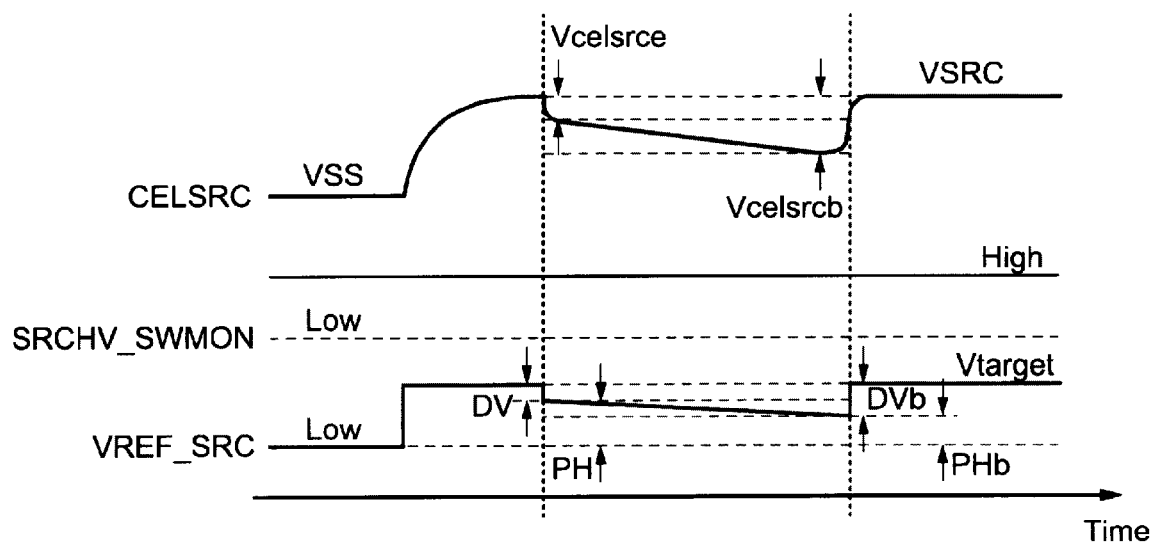

FIGS. 9A and 9B are timing charts illustrating a modification example of the read operation in the semiconductor memory device 1 according to the first embodiment. Hereinafter, the modification example of the read operation of the semiconductor memory device 1 according to the first embodiment will be described with reference to FIGS. 9A and 9B. FIGS. 9A and 9B differ from FIG. 8 in that the voltage applied to the source line CELSRC or the time during which the voltage of the source line CELSRC is lowered is changed in accordance with the change in the transition time SPW of the voltage VREF_SRC. In FIGS. 9A and 9B, since the other points are the same as those in FIG. 8, the description thereof is omitted here. Description of configurations that are the same as or similar to those in FIGS. 1 to 7 may be omitted.

FIG. 9A illustrates a first modification example of the read operation in the semiconductor memory device 1 according to the first embodiment. In the first modification example, an example in which the transition time SPW of the voltage VREF_SRC is expanded to a transition time SPWb is illustrated. The source line voltage drop width corresponding to the transition time SPWb of the voltage VREF_SRC is referred to as a source line voltage drop width CPWb.

As the transition time SPW of the voltage VREF_SRC is expanded to the transition time SPWb, the time during which the voltage VREF_SRC is at a voltage (voltage Vtarget–voltage DV) which is lower than the voltage Vtarget by the voltage DV becomes longer. As a result, the time during which the voltage "voltage VSRC–voltage Vcelsrc" is applied to the source line CELSRC becomes longer. As the time during which the voltage "voltage VSRC–voltage Vcelsrc" is applied to the source line CELSRC becomes longer, for example, the bit line BL on the far-end side can also be charged faster, and can be converged to a constant value faster than in the example of related art. A control signal pulse width SPW or a control signal pulse width SPWb is adjusted to be, for example, one microsecond or more and ten microseconds or less. Therefore, the source line voltage drop width CPW or the source line voltage drop width CPWb is also adjusted to be, for example, one microsecond or more and ten microseconds or less.

The voltage DV may be changed without changing the transition time SPW of the voltage VREF_SRC. The voltage VREF_SRC may be lower than "target voltage Vtarget–voltage DV", and the voltage VREF_SRC may be higher than "target voltage Vtarget–voltage DV". For example, the voltage of the source line CELSRC may be decreased below the "voltage VSRC–voltage Vcelsrc" by decreasing the voltage VREF_SRC below the "voltage VSRC–voltage Vcelsrc". For example, a plurality of voltages corresponding to the voltage VREF_SRC may be generated in the voltage generation circuit 18 in advance, and the generated voltage may be controlled to be applied to the voltage VREF_SRC based on a desired read operation by the memory controller 2. For example, as illustrated in FIG. 9A, control may be performed so that the "target voltage Vtarget–voltage DVb" is applied to the voltage VREF_SRC and the voltage Vcelsrcb corresponding to the voltage DVb is applied to the source line CELSRC. Here, ideally, the voltage DVb is the voltage Vcelsrcb, but, actually, the voltage DV adjusts the voltage DVb so that the voltage of the source line CELSRC becomes the voltage Vcelsrcb by resistance, capacitance, and the like caused by transistors, wirings, and the like, similarly to the voltage Vcelsrc. The voltage Vcelsrcb is larger than the voltage Vcelsrc, and the "voltage VSRC–voltage Vcelsrcb" is lower than the "voltage VSRC–voltage Vcelsrc". For example, the voltage Vcelsrc or the voltage Vcelsrcb is adjusted to be 5% or more and 90% or less of the voltage VSRC which is the target voltage. Similarly to the voltage Vcelsrc and the voltage Vcelsrcb, the voltage DV or the voltage DVb is also adjusted to be, for example, a voltage that is 5% or more and 90% or less of the target voltage Vtarget.

Therefore, the voltage difference between the gate of the memory cell transistor MT and the terminal connected to the select transistor TS2 of the memory cell transistor MT is increased, and as a result, similarly to the case where the transition time of the voltage VREF_SRC is expanded, the time during which the voltage VREF_SRC is at a voltage (voltage Vtarget–voltage DVb) lower than the voltage Vtarget by the voltage DVb becomes longer. As a result, the time during which the "voltage VSRC–voltage Vcelsrcb" is applied to the source line CELSRC becomes longer. Therefore, the bit line BL on the far-end side can also be charged quickly, and can be converged to a constant value faster than in the example of related art.

In the semiconductor memory device 1 according to the first embodiment, both the expansion of the transition time of the voltage VREF_SRC and the reduction of the voltage of the source line CELSRC below the "voltage VSRC–voltage Vcelsrc" may be applied.

FIG. 9B illustrates a second modification example of the read operation in the semiconductor memory device 1 according to the first embodiment. In the second modification example, after the voltage of the source line CELSRC is set to the voltage Vcelsrc, control is performed so as to gradually decrease the voltage of the source line CELSRC to the voltage Vcelsrcb.

For example, a plurality of voltages that gradually decreases with time according to the voltage VREF_SRC may be generated in advance in the voltage generation circuit 18, and the generated voltage may be controlled to be applied to the voltage VREF_SRC based on a desired read operation by the memory controller 2. For example, as illustrated in FIG. 9B, control may be performed so that a ramp-shaped voltage that gradually decreases from the target voltage Vtarget to the voltage DVb is applied to the voltage VREF_SRC, and a ramp wave-shaped voltage that gradually decreases from the voltage Vcelsrc to the voltage Vcelsrcb is applied to the source line CELSRC. In FIG. 9B, while an example in which a ramp wave-shaped voltage that gradually decreases linearly from the target voltage Vtarget to the voltage DVb is applied to the voltage VREF_SRC is illustrated, the voltage applied to the voltage VREF_SRC is not limited to the example illustrated here. For example, the voltage generated with the time according to the voltage VREF_SRC in the voltage generation circuit 18 may be a voltage that decreases in a stepwise (step-like), and the voltage that decreases stepwise (step-like) may be applied to the voltage VREF_SRC.

By applying a voltage as illustrated in FIG. 9B to the source line CELSRC, for example, even when the rate at which the voltage of the selected word line WL_sel gradually decreases from the near-end side to the far-end side of the selected word line WL_sel is not constant, and the like, a voltage corresponding to a voltage change from the near-end side to the far-end side of the selected word line WL_sel and the source line CELSRC may be applied from the near-end side to the far-end side of the bit line BL.

Second Embodiment

In the semiconductor memory device 1 according to a second embodiment, an example in which a kick operation is performed on the control signal BLC in addition to the read operation described in FIG. 8 will be described.

Figure 10:
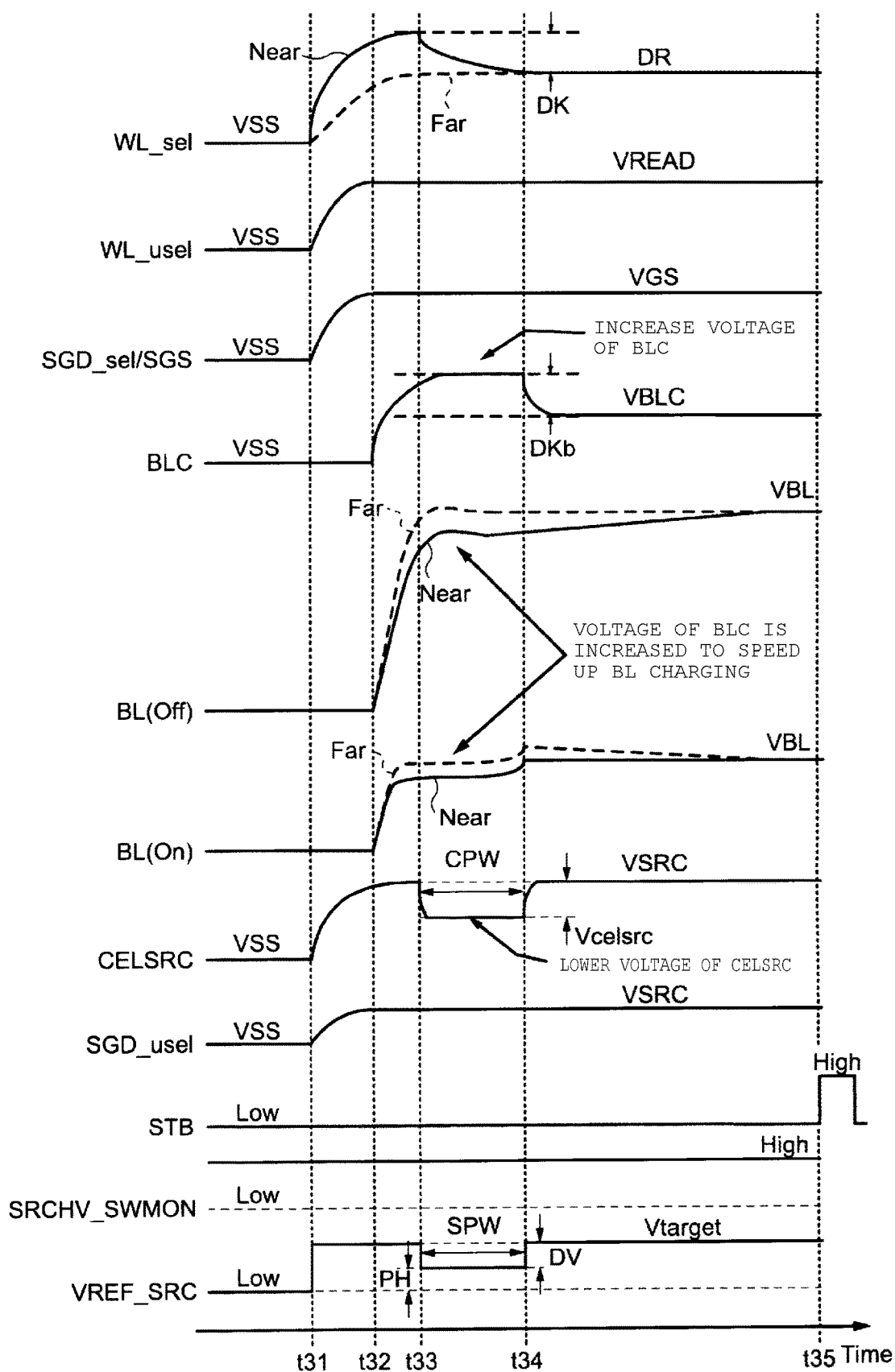
FIG. 10 is a timing chart illustrating an example of changes in voltages applied to various circuit components used in a read operation according to a second embodiment.

Hereinafter, with reference to FIG. 10, an example of changes in voltages applied to various circuit components used in the read operation in the semiconductor memory device according to the second embodiment will be described in detail. FIG. 10 differs from FIG. 8 in changes in voltages applied to the control signal BLC and the bit line BL. In FIG. 10, since the other points are the same as those in FIG. 8, the description thereof is omitted here. Description of configurations that are the same as or similar to those in FIGS. 1 to 9 may be omitted.

At time t32, charging of the bit line BL is started. In the charging, at time t32, the voltage of the control signal BLC is set to a voltage obtained by adding the kick amount DKb to the voltage VBLC which is the target voltage.

Subsequently, at time t33, the voltage VREF_SRC changes to a voltage (voltage Vtarget−voltage DV) which is lower than the voltage Vtarget by the voltage DV. As a result of the voltage VREF_SRC changing to a voltage (voltage Vtarget −voltage DV) which is lower than the voltage Vtarget by the voltage DV, a voltage (voltage VSRC−voltage Vcelsrc) which is lower than the voltage VSRC by the voltage Vcelsrc is applied to the source line CELSRC by the discharge unit 192 and the reference voltage setting unit 194 illustrated in FIG. 6. Here, the voltage Vcelsrc is a voltage according to the voltage VREF_SRC, for example. The change (voltage difference between the target voltage Vtarget and the voltage DVb) in the voltage VREF_SRC is referred to as a voltage difference PHb.

As the voltage (VSRC-Vcelsrc) which is lower than the voltage VSRC by the voltage Vcelsrc is applied to the source line CELSRC, the voltage difference between the gate of the memory cell transistor MT and the terminal connected to the select transistor TS2 of the memory cell transistor MT is increased, and thus the bit line BL can be charged quickly. As a result, the voltage applied to the bit line BL converges to a constant value faster than in the example of related art.

By performing the kick operation on the control signal BLC, the voltage difference between the gate of the transistor Tr2 and the first terminal of the transistor Tr2 increases. As a result, the bit line BL connected to the connection unit 111 including the transistor Tr2 is overcharged. In the semiconductor memory device 1 according to the first embodiment that enables a high-speed operation by lowering the voltage applied to the source line CELSRC, as illustrated in the waveform of the bit line BL from time t23 to time t25 in FIG. 8, the voltage applied to the bit line BL from time t23 to time t24 is different from the voltage VBL which is the target voltage. In the semiconductor memory device 1 according to the second embodiment, the kick operation is performed on the control signal BLC and the bit line BL connected to the connection unit 111 including the transistor Tr2 is overcharged. Accordingly, as illustrated in FIGS. 9A and 9B, the bit line BL is charged at high speed, and the difference from the voltage VBL, which is the target voltage, can be reduced. As a result, in the semiconductor memory device 1 according to the second embodiment, the time until the bit line BL converges to the voltage VBL which is the target voltage is further shortened, and the time (for example, time t33 to time t35) until the read operation can be further shortened.

Other Embodiments

Each unit described as the configuration in the semiconductor memory device in the first embodiment and the second embodiment may be implemented by either hardware or software, or implemented by a combination of hardware and software.

In the first embodiment and the second embodiment, when the notations of the same and coincidence are used, the same and coincidence may include a case where an error a design range is included.

When it is written that a certain voltage is applied or supplied, it includes both of performing control to apply or supply the voltage and actually applying or supplying the voltage. Furthermore, applying or supplying a certain voltage may include applying or supplying a voltage of, for example, 0 V.

In this specification, "connection" indicates an electrical connection between elements, and does not exclude, for example, that another element is interposed between elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell;
a word line connected to the memory cell;
a source line connected to the memory cell;
a bit line connected to the memory cell; and
a control circuit configured to perform a read operation on the memory cell by:
applying to the word line a first voltage, a second voltage greater than the first voltage after applying the first voltage, and a third voltage greater than the first voltage and smaller than the second voltage after applying the second voltage, and
applying to the source line a fourth voltage according to a timing at which the second voltage is applied to the word line, a fifth voltage smaller than the fourth voltage after applying the fourth voltage, and a sixth voltage greater than the fifth voltage after applying the fifth voltage and while applying the third voltage to the word line.

2. The semiconductor memory device according to claim 1, wherein the source line is connected to a node having a voltage set according to a reference voltage and the reference voltage is decreased at the timing at which the fifth voltage is applied to the source line and increased at the timing at which the sixth voltage is applied to the source line.

3. The semiconductor memory device according to claim 2, wherein the reference voltage is maintained constant between the timing at which the fifth voltage is applied to the source line and the timing at which the sixth voltage is applied to the source line.

4. The semiconductor memory device according to claim 2, wherein the reference voltage is varied between the timing at which the fourth voltage is applied to the source line and the timing at which the fifth voltage is applied to the source line.

5. The semiconductor memory device according to claim 4, wherein the reference voltage is decreased between the timing at which the fourth voltage is applied to the source line and the timing at which the fifth voltage is applied to the source line.

6. The semiconductor memory device according to claim 1, wherein the control circuit is configured to
control a first control signal for controlling a voltage to be applied to the bit line, to change from a low level to a high level according to the timing at which the second voltage is applied to the word line.

7. The semiconductor memory device according to claim 6, wherein
the fifth voltage is applied as the first control signal changes from the low level to the high level.

8. The semiconductor memory device according to claim 1, wherein the control circuit is configured to
control a first control signal for controlling a voltage to be applied to the bit line, to change from a low level to a high level according to the timing at which the second voltage is applied to the word line, and then to an intermediate level between the low level and the high level.

9. The semiconductor memory device according to claim 8, wherein
the fifth voltage is applied to the source line while the first control signal is at the high level and the sixth voltage is applied to the source line at a timing at which the first control signal is controlled to change to the intermediate level.

10. A method of performing a read operation in a semiconductor memory device that includes a memory cell, a word line connected to the memory cell, a source line connected to the memory cell, and a bit line connected to the memory cell, said method comprising:
applying to the word line a first voltage, a second voltage greater than the first voltage after applying the first voltage, and a third voltage greater than the first voltage and smaller than the second voltage after applying the second voltage; and
applying to the source line a fourth voltage according to a timing at which the second voltage is applied to the word line, a fifth voltage smaller than the fourth voltage after applying the fourth voltage, and a sixth voltage greater than the fifth voltage after applying the fifth voltage and while applying the third voltage to the word line.

11. The method according to claim 10, wherein the source line is connected to a node having a voltage set according to a reference voltage and the reference voltage is decreased at the timing at which the fifth voltage is applied to the source line and increased at the timing at which the sixth voltage is applied to the source line.

12. The method according to claim 11, wherein the reference voltage is maintained constant between the timing at which the fifth voltage is applied to the source line and the timing at which the sixth voltage is applied to the source line.

13. The method according to claim 11, wherein the reference voltage is varied between the timing at which the fourth voltage is applied to the source line and the timing at which the fifth voltage is applied to the source line.

14. The method according to claim 13, wherein the reference voltage is decreased between the timing at which the fourth voltage is applied to the source line and the timing at which the fifth voltage is applied to the source line.

15. The method according to claim 10, further comprising:
changing a first control signal for controlling a voltage to be applied to the bit line, to go from a low level to a high level according to the timing at which the second voltage is applied to the word line.

16. The method according to claim 15, wherein
the fifth voltage is applied as the first control signal changes from the low level to the high level.

17. The method according to claim 10, further comprising:
changing a first control signal for controlling a voltage to be applied to the bit line, to go from a low level to a high level according to the timing at which the second voltage is applied to the word line, and then to an intermediate level between the low level and the high level.

18. The method according to claim 17, wherein
the fifth voltage is applied to the source line while the first control signal is at the high level and the sixth voltage is applied to the source line at a timing at which the first control signal is controlled to go to the intermediate level.

* * * * *